(12) United States Patent
Yu et al.

(10) Patent No.: US 6,709,924 B1
(45) Date of Patent: Mar. 23, 2004

(54) FABRICATION OF SHALLOW TRENCH ISOLATION STRUCTURES WITH ROUNDED CORNER AND SELF-ALIGNED GATE

(75) Inventors: Allen S. Yu, Fremont, CA (US); Jeffrey A. Shields, Sunnyvale, CA (US); Allison Holbrook, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/292,121

(22) Filed: Nov. 12, 2002

(51) Int. Cl.[7] .................... H01L 21/336; H01L 21/331; H01L 21/76; H01L 21/302
(52) U.S. Cl. .................... 438/257; 296/359; 296/424; 296/425; 296/426; 296/435; 296/706; 296/725; 438/978
(58) Field of Search .................... 438/257, 296, 438/359, 424, 425, 426, 435, 706, 725, 978

(56) References Cited

U.S. PATENT DOCUMENTS 5,128,743 A * 7/1992 Tamaki et al. ............... 257/513
6,548,371 B2 * 4/2003 Fujimaki .................... 438/424
2002/0072197 A1 * 6/2002 Kang et al. ................. 438/424

* cited by examiner

Primary Examiner—John F. Niebling
Assistant Examiner—Stanetta Isaac
(74) Attorney, Agent, or Firm—Monica H. Choi

(57) ABSTRACT

For fabricating a shallow trench isolation structure, a notched masking structure is formed over an active area of a semiconductor substrate. A shallow trench opening is formed at a side of the active area with a top corner of the shallow trench opening being exposed and facing a notched surface of the notched masking structure. Liner oxide is formed in a thermal oxidation process at the top corner of the shallow trench opening to round the top corner of the shallow trench opening. The liner oxide may also be formed on walls including the bottom corner of the shallow trench opening during the thermal oxidation process. The shallow trench opening is then filled with a trench dielectric material to form the shallow trench isolation structure.

21 Claims, 13 Drawing Sheets

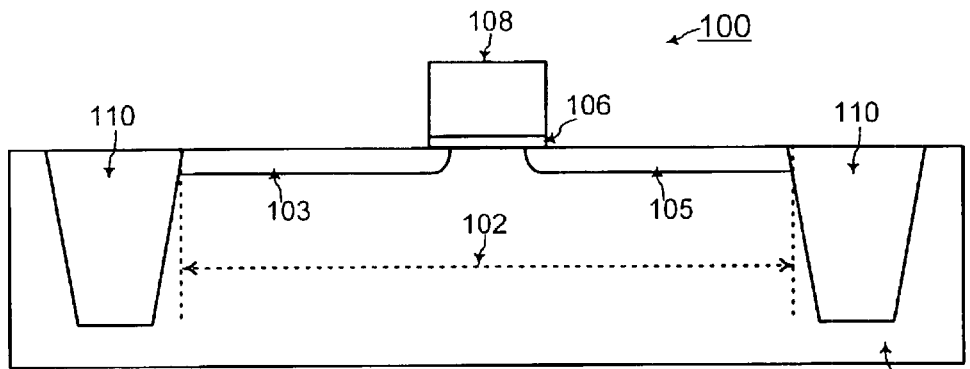
FIG. 1 *(Prior Art)*
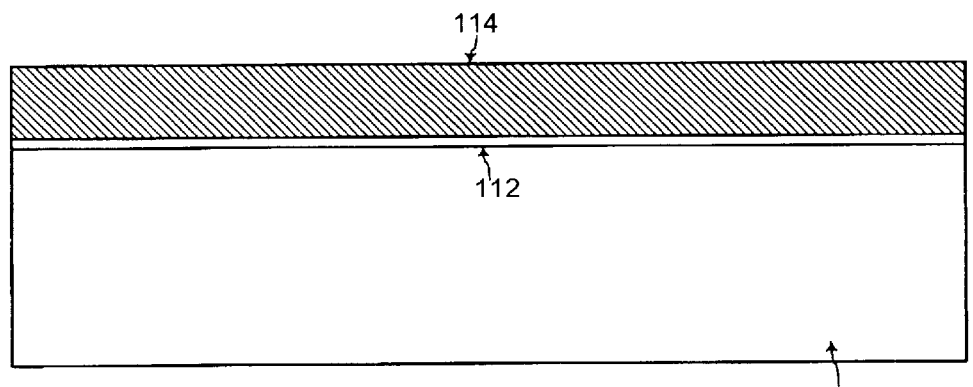
FIG. 2 *(Prior Art)*
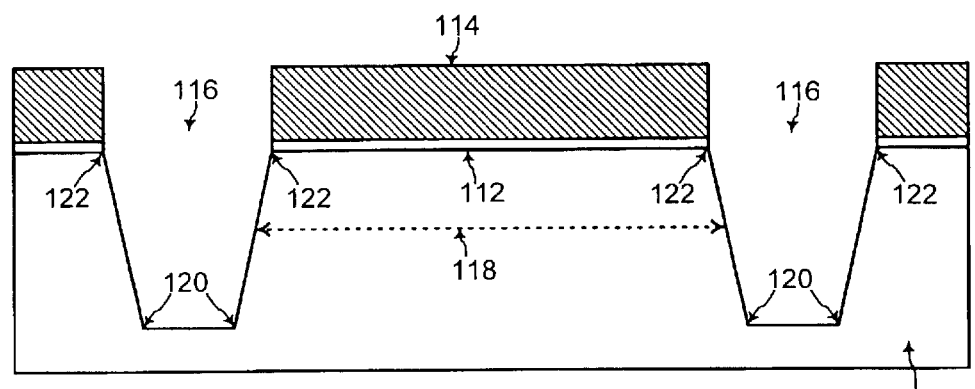
FIG. 3 *(Prior Art)*

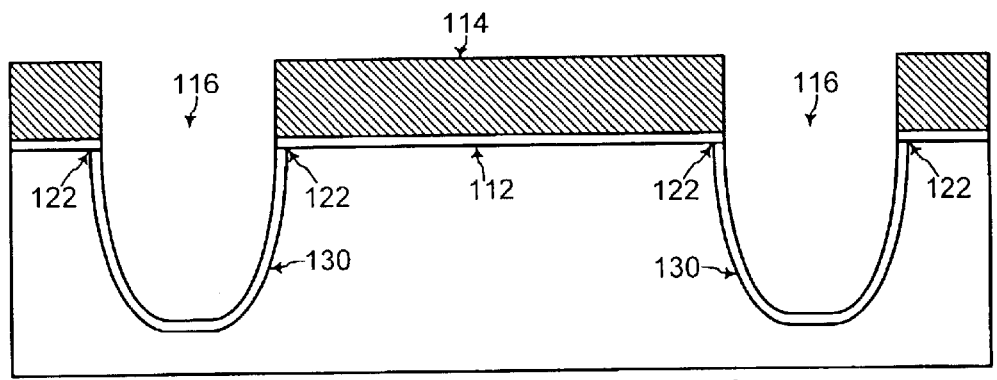
FIG. 4 *(Prior Art)*
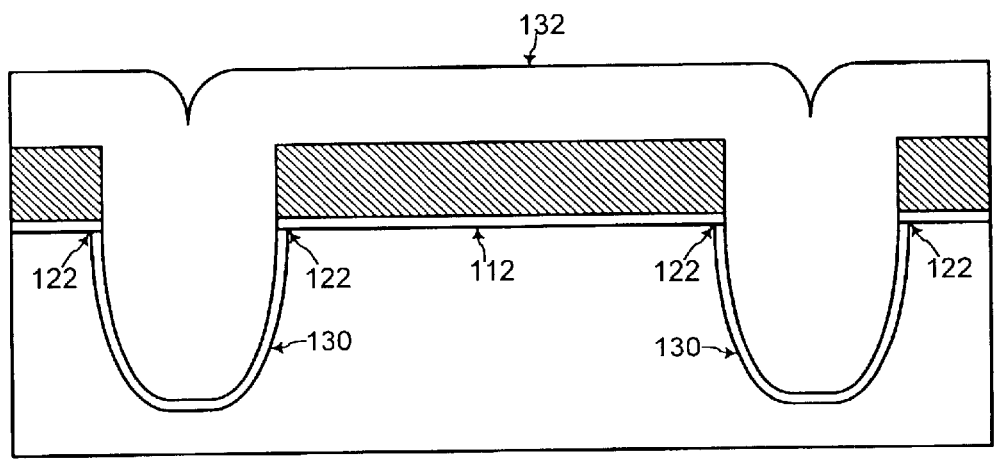
FIG. 5 *(Prior Art)*
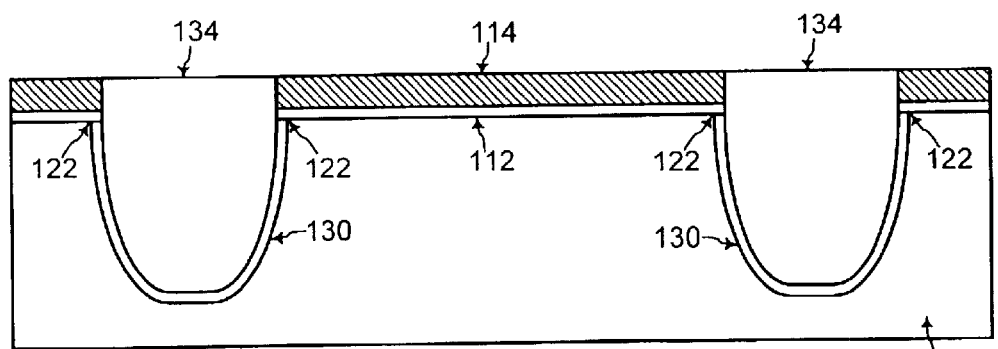
FIG. 6 *(Prior Art)*

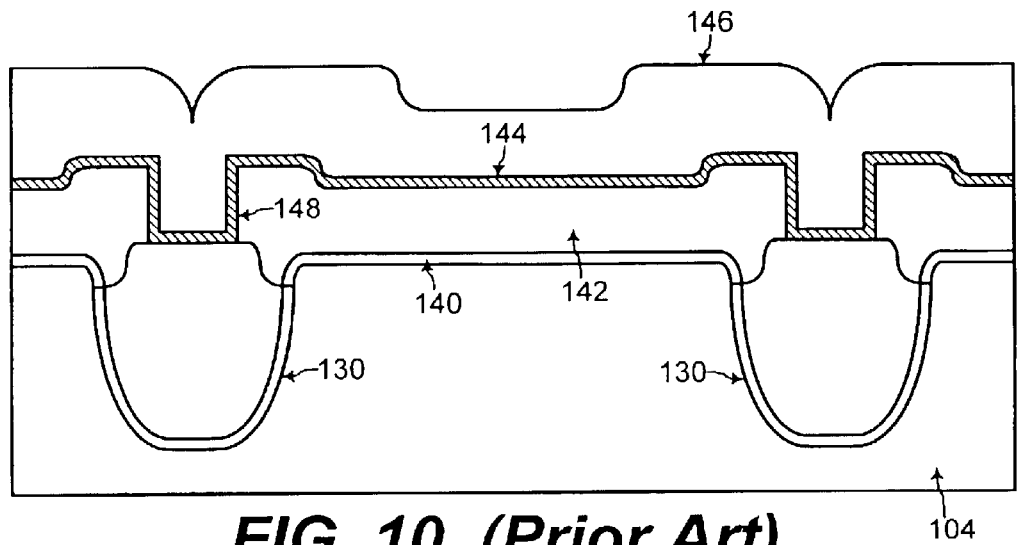
FIG. 10 *(Prior Art)*
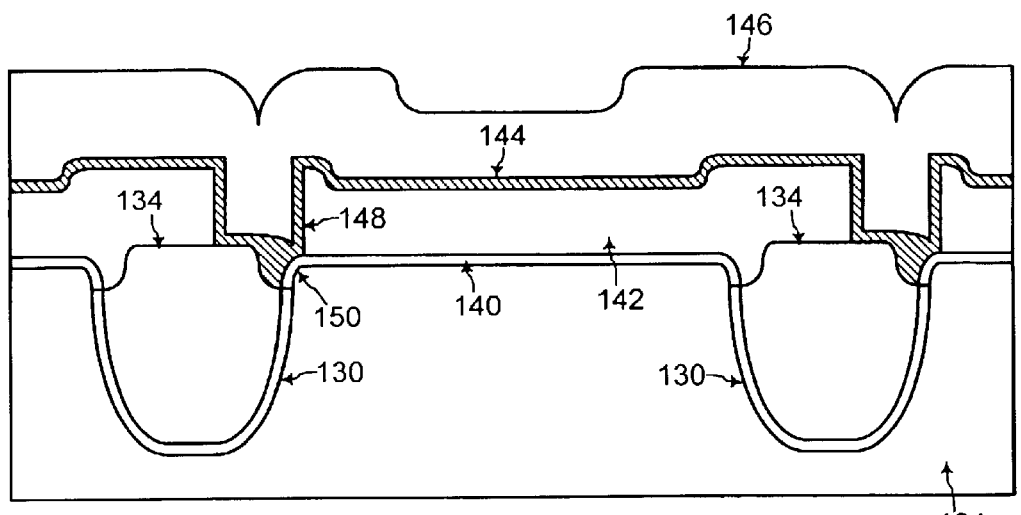
FIG. 11 *(Prior Art)*

US 6,709,924 B1

FABRICATION OF SHALLOW TRENCH ISOLATION STRUCTURES WITH ROUNDED CORNER AND SELF-ALIGNED GATE

TECHNICAL FIELD

The present invention relates generally to fabrication of integrated circuits, and more particularly, to a method of fabricating shallow trench isolation structures with rounded corners and self-aligned gate, with a minimized number of processing steps.

BACKGROUND OF THE INVENTION

Referring to FIG. 1, an integrated circuit device such as a MOSFET (metal oxide semiconductor field effect transistor) 100 is fabricated within an active area 102 of a semiconductor substrate 104. The MOSFET 100 includes a drain region 103, a source region 105, a gate dielectric 106, and a gate structure 108, and such a MOSFET 100 is known to one of ordinary skill in the art of integrated circuit fabrication.

The active area 102 is defined by shallow trench isolation structures 110 formed to surround and electrically isolate the active area 102. The semiconductor substrate 104 is typically comprised of silicon, and the shallow trench isolation structures 110 are comprised of a dielectric material such as silicon dioxide ($SiO_2$) or a low-k dielectric material, as known to one of ordinary skill in the art of integrated circuit fabrication.

Referring to FIG. 2, for forming shallow trench isolation structures, a layer of pad oxide 112 comprised of silicon dioxide ($SiO_2$) is deposited on the semiconductor substrate 104, and a layer of silicon nitride ($Si_xN_y$) 114 is deposited on the layer of pad oxide 112. Processes for depositing the layer of pad oxide 112 and the layer of silicon nitride 114 are known to one of ordinary skill in the art of integrated circuit fabrication. Referring to FIGS. 2 and 3, the layer of silicon nitride 114, the layer of pad oxide 112, and the semiconductor substrate 104 are patterned to form shallow trench openings 116 surrounding an active area 118 of the semiconductor substrate 104. Processes for patterning the layer of silicon nitride 114, the layer of pad oxide 112, and the semiconductor substrate 104 to form the shallow trench openings 116 are known to one of ordinary skill in the art of integrated circuit fabrication.

In a typical process for patterning the layer of silicon nitride 114, the layer of pad oxide 112, and the semiconductor substrate 104 to form the shallow trench openings 116, bottom corners 120 and top corners 122 of the shallow trench openings 116 are formed to be relatively sharp, as known to one of ordinary skill in the art of integrated circuit fabrication. However, such sharp corners may result in the "kink effect" where uneven distribution of charge carriers leads to high electric fields at such corners, as known to one of ordinary skill in the art of integrated circuit fabrication.

Referring to FIGS. 3 and 4, for rounding the bottom corners 120 of the shallow trench openings 116, a thermal oxidation process is performed for forming liner oxide 130 at the walls of the shallow trench openings 116. Such formation of the liner oxide 130 rounds the bottom corners 120 of the shallow trench openings 116. However, nitrogen is an oxidation-retarding agent, as known to one of ordinary skill in the art of integrated circuit fabrication. Thus, in the prior art, the silicon nitride 114 disposed directly above the top corners 122 of the shallow trench openings 116 inhibit formation of the liner oxide 130 at the top corners 122 of the shallow trench openings 116. Thus, the top corners 122 of the shallow trench openings 116 are not rounded after formation of the liner oxide 130.

Referring to FIGS. 4 and 5, a trench dielectric material 132 such as silicon dioxide ($SiO_2$) or a low-k dielectric material is deposited to fill the shallow trench openings 116. Referring to FIGS. 5 and 6, materials on the semiconductor substrate 104 are polished down such that the trench dielectric material 132 is contained within the shallow trench openings 116 to form the shallow trench isolation structures 134. Referring to FIGS. 6 and 7, the remaining silicon nitride 114 is etched away. Such processes for forming the shallow trench isolation structures 134 of FIG. 7 are known to one of ordinary skill in the art of integrated circuit fabrication.

Referring to FIGS. 7 and 8, an additional etch process such as a HF (hydrofluoric) dip is performed to etch away the pad oxide 112 and to etch away side portions of the shallow trench isolation structures 134 for exposing the top corners 122 near the shallow trench isolation structures 134. Such an etch process is known to one of ordinary skill in the art of integrated circuit fabrication. Referring to FIGS. 8 and 9, an additional thermal oxidation process is performed to form additional top oxide 136 at the top corners 122 of the shallow trench isolation structures 134 for rounding such top corners 122. However, such processing steps for exposing and rounding the top corners 122 near the shallow trench isolation structures 134 disadvantageously increase the number of processing steps in the prior art.

Referring to FIGS. 10 and 11, for fabricating a flash memory cell within the active area 118 of the semiconductor substrate 104, a tunneling gate dielectric 140 is formed on the active area 118 of the semiconductor substrate 104, and a floating gate 142 is formed on the tunneling gate dielectric 140. In addition, a control gate dielectric 144 is formed on the floating gate 142 across the floating gates of a row of flash memory cells separated by shallow trench isolation structures 134. Furthermore, a control gate material 146 is formed on the control gate dielectric 144 across such a row of flash memory cells. Such structures 140, 142, 144, and 146 for a flash memory cell are known to one of ordinary skill in the art of electronics.

In the prior art of FIG. 10, the top surface of the control gate material 146 is substantially non-planar. Such a non-planar surface causes optical inference in subsequent photolithography processes such that a lower number of contacts may be formed. A lower number of contacts disadvantageously increases the number of interconnect levels. In addition, with such non-planar topology of the flash memory cell of FIG. 10, a lower number of rows of control gates may be formed for a disadvantageously lower density of flash memory cells that may be formed with such non-planar gate stack structures of FIG. 10.

Furthermore, referring to FIGS. 10 and 11, with the prior art structures 140, 142, 144, and 146 of the flash memory cells, if the structures 140, 142, 144, and 146 are fabricated to be mis-aligned with the shallow trench isolation structures 134, then the flash memory cell may be in-operative. For example in FIG. 11, the floating gate 134 and the control gate dielectric 144 are formed shifted too much to the right such that the control gate dielectric 144 makes contact with the tunneling gate dielectric 140 at area 150. In that case, the flash memory cell comprised of such shifted floating gate 134 and control gate dielectric 144 is in-operative.

For proper operation of a flash memory cell, all four layers of the tunneling gate dielectric 140, the floating gate 142, the control gate dielectric 144, and the control gate material 146 should be disposed over the active area 118 of the semiconductor substrate 102. Thus, the groove 148 of the control gate dielectric 144 needs to be placed within the width of the shallow trench isolation structures 134 for the flash memory cell to be operative. The groove 148 of the control gate dielectric 144 separates two adjacent rows of floating gates, and thus, the groove 148 of the control gate dielectric 144 should be placed within the shallow trench isolation structures 134.

However, with mis-alignment in stepper tools for forming the control gate dielectric 144 and especially with decreasing dimensions of integrated circuit devices, such alignment is difficult to achieve, especially as mis-alignment in stepper tools are typically always present. Aligning the groove 148 of the control gate dielectric 144 may be the most difficult task in forming operative flash memory cells with the prior art gate stack structures 140, 142, 144, and 146 of FIG. 10.

Thus, a method is desired for fabricating the shallow trench isolation structures without such disadvantages of the prior art.

SUMMARY OF THE INVENTION

Accordingly, in a general aspect of the present invention, a notched masking structure is used for patterning shallow trench openings with top corners of the shallow trench openings exposed to oxidation for rounding such top corners of the shallow trench openings during formation of liner oxide at the walls of the shallow trench openings. In addition, the notched masking structure may form a self-aligned floating gate of a flash memory cell with a polishing step for forming a flash memory cell with planar surfaces.

In one embodiment of the present invention, for fabricating shallow trench isolation structures, a notched masking structure is formed over an active area of a semiconductor substrate. The notched masking structure has a notched shape with wider width toward the top and with narrower width toward the bottom nearer the active area of the semiconductor substrate. The semiconductor substrate is patterned with the notched masking structure acting as a mask in an anisotropic etch process to form at least one shallow trench opening toward at least one side of the active area of the semiconductor substrate. A top corner of the shallow trench opening is disposed under a notched surface of the notched masking structure.

A thermal oxidation process is performed for forming liner oxide on at least one wall and at the top corner of the shallow trench opening. Formation of the liner oxide at the top corner of the shallow trench opening rounds the top corner of the shallow trench opening. The at least one shallow trench opening is filled with a trench dielectric material.

In another embodiment of the present invention, materials on the semiconductor substrate are polished down until the notched masking structure is exposed such that the trench dielectric material is contained within the at least one shallow trench opening and to sides of the notched masking structure.

In a further embodiment of the present invention, a tunneling gate dielectric is formed on the active area of the semiconductor substrate and at a bottom of the notched masking structure, and the notched masking structure is comprised of a floating gate material, for fabricating a flash memory cell in the active area of the semiconductor substrate. A layer of control gate dielectric is deposited on the exposed surface of the notched masking structure and on the exposed surface of the trench dielectric material after the polishing step. In addition, a layer of control gate material is deposited on the layer of control gate dielectric, and drain and source regions of the flash memory cell are formed within the active area of the semiconductor substrate.

In this embodiment of the present invention, the notched masking structure forms a floating gate of the flash memory cell. The notched shape of the floating gate forms a first overlap area between a top surface of the floating gate and the control gate material that is larger than a second overlap area between a bottom of the floating gate and the active area of the semiconductor substrate. Thus, the coupling ratio, which is a measure of the amount of charge stored within the floating gate for a given voltage applied at the control gate, is advantageously maximized for the flash memory cell.

In yet another embodiment of the present invention, the notched masking structure is etched away to expose the active area of the semiconductor substrate. In that case, an integrated circuit device such as a field effect transistor is fabricated within the active area of the semiconductor substrate.

In this manner, because the masking structure used for patterning the shallow trench openings is notched, the top corners of the shallow trench openings are exposed to oxidation to be rounded during formation of liner oxide on the sides of the shallow trench openings. In addition, when the notched masking structure is formed also to be a floating gate of a flash memory cell with a polishing step, such a flash memory cell is formed to have a planar top surface and to be self-aligned for proper operation of the flash memory cell.

These and other features and advantages of the present invention will be better understood by considering the following detailed description of the invention which is presented with the attached drawings.

BRIEF DESCRIPTION OF THE DRAWINGS

FIG. 1 shows a cross-sectional view of typical shallow trench isolation structures surrounding an active area of a semiconductor substrate having a field effect transistor fabricated therein, according to the prior art;

FIGS. 2, 3, 4, 5, 6, 7, 8, 9, 10, and 11 show cross-sectional views for forming shallow trench isolation structures surrounding an active area of a semiconductor substrate having a flash memory cell fabricated therein, with a non-planar top surface, with potential mis-alignment of the grooves that separate the adjacent floating gates, and with an additional thermal oxidation step for rounding top corners of the active area, according to the prior art;

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20, 21, 22, 23, 24, 25, 26, 27, 28, 29, and 30 refer to elements having similar structure and function.

DETAILED DESCRIPTION

Figure 7:
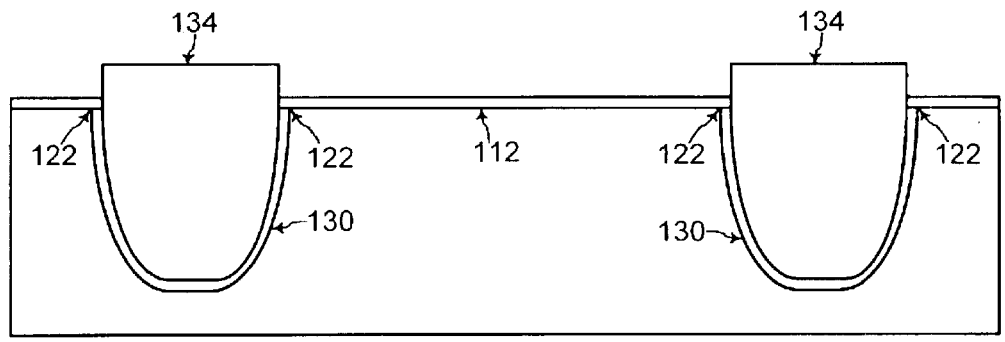
Figure 8:
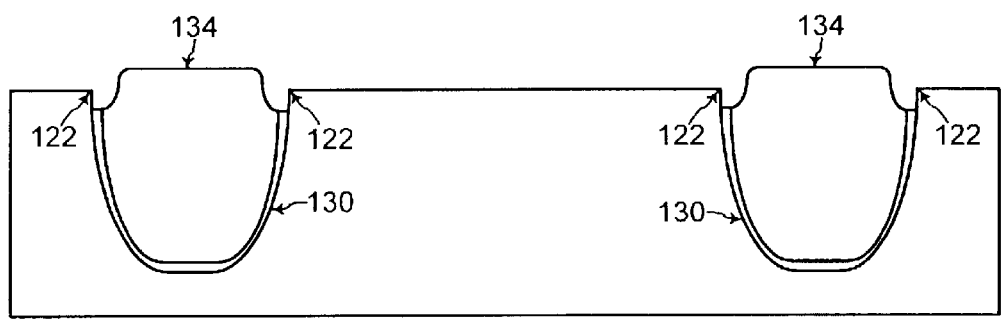
Figure 9:
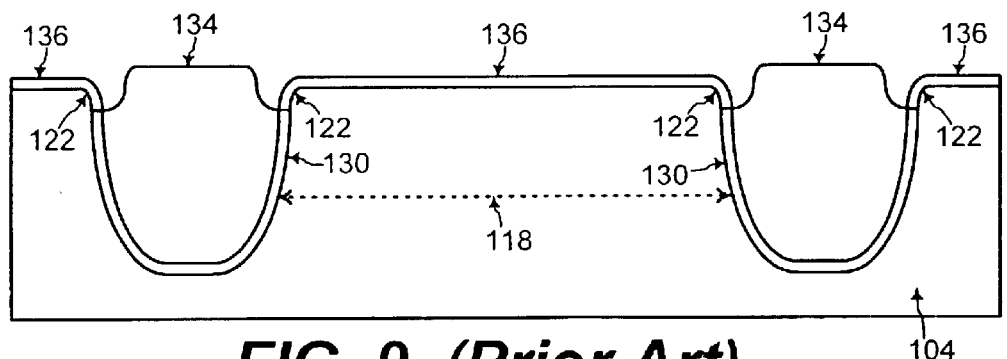
Figure 12:
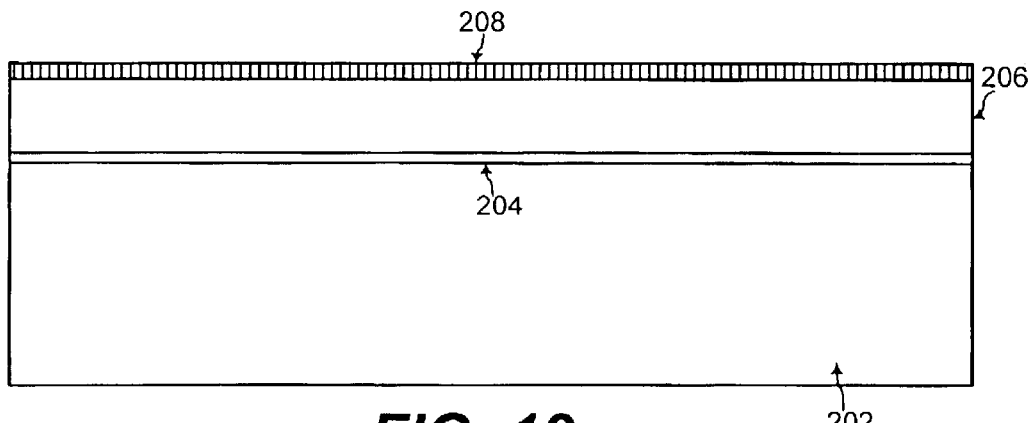
FIGS. 12, 13, 14, 15, 16, 17, 18, 19, 20, and 21 show cross-sectional views for forming shallow trench isolation structures surrounding an active area of a semiconductor substrate having a flash memory cell fabricated therein, using a notched masking structure also forming a floating gate, according to an embodiment of the present invention.

Referring to FIG. 12, for fabricating shallow trench isolation structures within a semiconductor substrate 202 according to an embodiment of the present invention, a layer of tunneling gate dielectric 204 is deposited on the semiconductor substrate 202. In addition, a layer of floating gate material 206 is deposited on the layer of tunneling gate dielectric 204, and a layer of ARC (anti-reflective coating) material 208 is deposited on the layer of floating gate material 206.

In one embodiment of the present invention, the semiconductor substrate 202 is comprised of silicon or silicon doped with germanium, and the tunneling gate dielectric 204 is comprised of silicon dioxide ($SiO_2$) or a high-k dielectric material (i.e., a dielectric material having a dielectric constant that is higher than that of silicon dioxide). In addition, in one example embodiment of the present invention, the floating gate material 206 is comprised of polysilicon, and the ARC (anti-reflective coating) material 208 is comprised of silicon nitride ($Si_xN_y$), silicon oxynitride (SiON), amorphous carbon, or multiple layers of such materials. Such materials and processes for deposition of such material to form the layers 204, 206, and 208 are known to one of ordinary skill in the art of integrated circuit fabrication.

Figure 13:
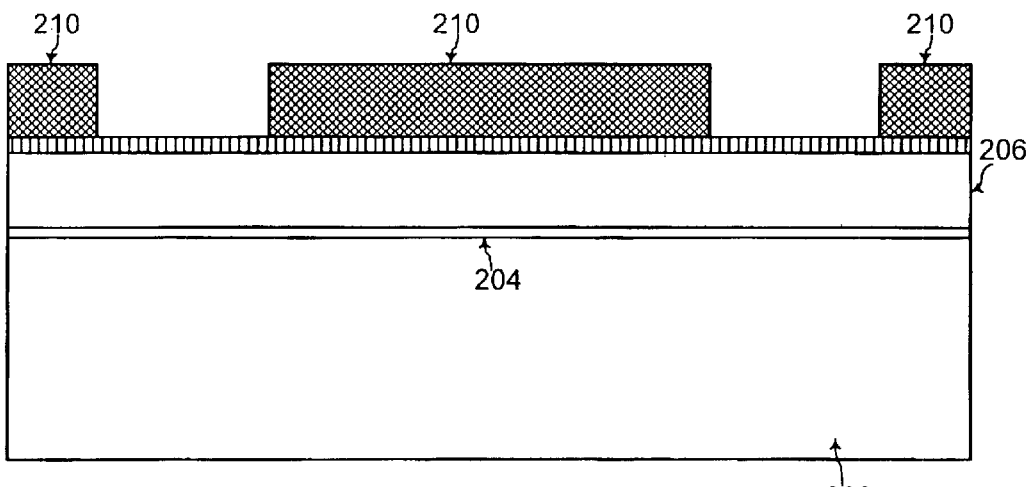

Referring to FIGS. 12 and 13, a layer of masking material 210 comprised of photo-resist material for example is patterned. Processes for patterning such masking material 210 is known to one of ordinary skill in the art of integrated circuit fabrication. The ARC (anti-reflective coating) material 208 enhances pattern transfer to the masking material 210 during a photolithography process for patterning the masking material 210 as known to one of ordinary skill in the art of integrated circuit fabrication.

Figure 14:
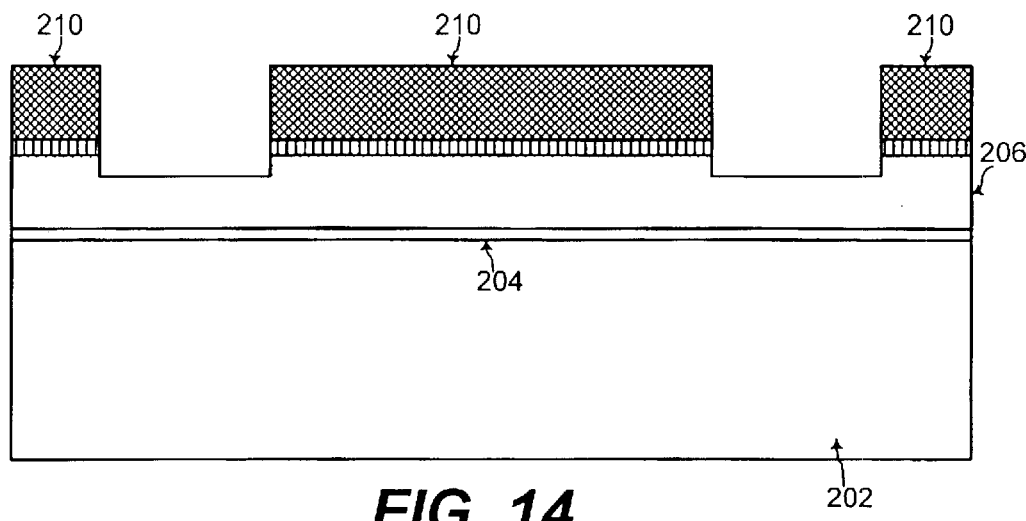

Referring to FIGS. 13 and 14, the portion of the ARC (anti-reflective coating) material 208 and a top portion of the floating gate material 206 not under the masking material 210 are etched away in an anisotropic etch process. An anisotropic etch process is a directional etch process, as known to one of ordinary skill in the art of integrated circuit fabrication. Thus, the exposed portion of the ARC (anti-reflective coating) material 208 and the top portion of the floating gate material 206 not under the masking material 210 are etched in a substantially down-ward direction as illustrated in FIG. 14.

Figure 15:
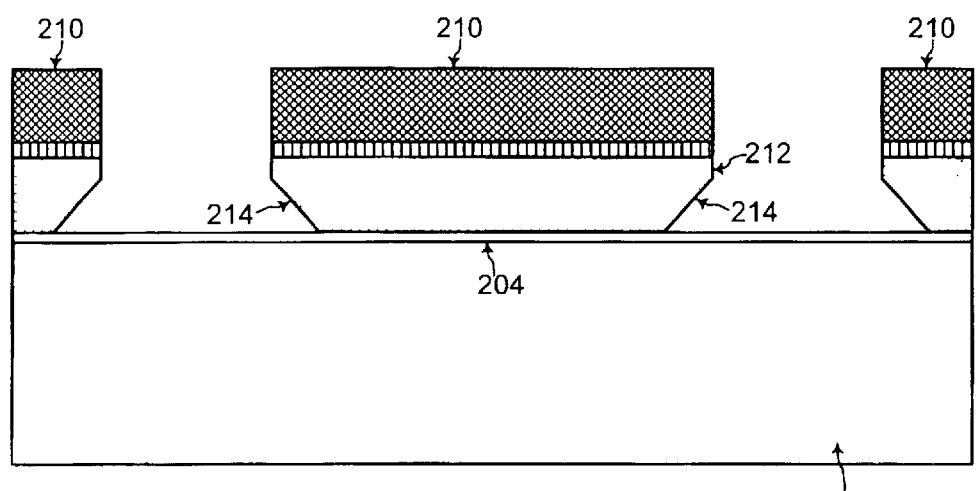

Referring to FIGS. 14 and 15, a partially isotropic etch process is then performed to etch a bottom portion of the exposed floating gate material 206 to form notched surfaces 214 of a notched masking structure 212 comprised of the remaining floating gate material 206. An isotropic etch process is a non-directional etch process, as known to one of ordinary skill in the art of integrated circuit fabrication. During the partially isotropic etch process, the etching agents etch further towards the sidewalls of the masking structure 212 for achieving the notched shape of the masking structure 212 that has a larger width toward the top nearer the ARC (anti-reflective coating) material 208 and a smaller width toward the bottom nearer the semiconductor substrate 202.

Such a partially isotropic etch process may be achieved for example when an etch process starts off being anisotropic but then when the concentration of an etching agent, such as chlorine for etching the floating gate material 206 comprised of polysilicon, is increased, the sidewalls of the masking structure 212 are further etched sideways to result in the notched shape. Alternatively, the partially isotropic etch process may be achieved by a combination of increasing the pressure within the etching chamber and/or decreasing a potential difference between the top electrode and the bottom electrode within a reactive ion etching chamber.

When the pressure within the etching chamber is increased, the etching ions become less directional to result in the notched shape of the masking structure 212. Similarly, in a RIE (reactive ion etching) process that has etching ions directed from the top electrode of the chamber toward the bottom electrode of the chamber from a potential difference between such top and bottom electrodes, with decrease of such a potential difference between the top and bottom electrodes, the etching ions become less directional to result in the notched shape of the masking structure 212.

Figure 16:
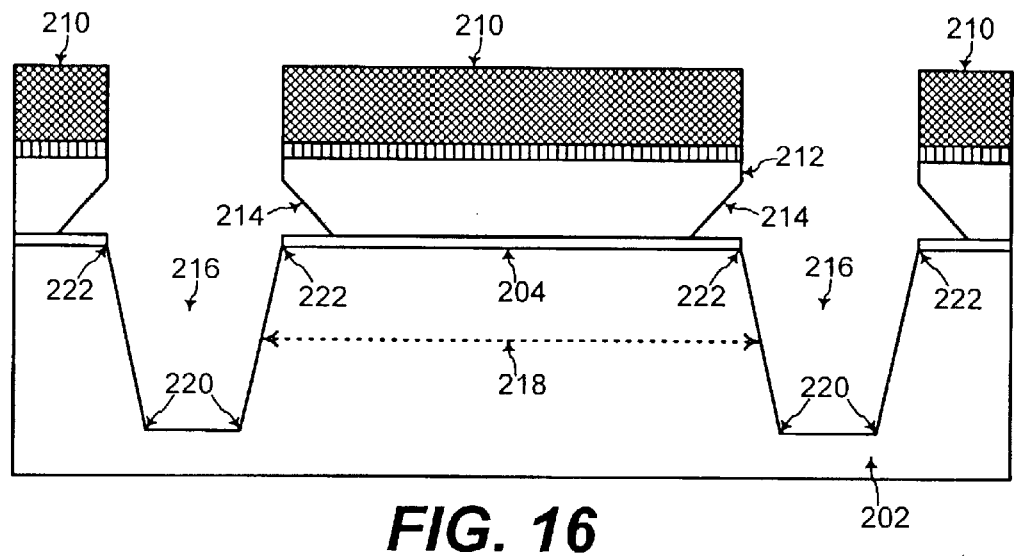

In any case, after formation of the notched masking structure 212 in a partially isotropic etch process, the tunneling gate dielectric 204 remains. Referring to FIGS. 15 and 16, an anisotropic etch process is performed for etching into the tunneling gate dielectric 204 and the semiconductor substrate 202 to form shallow trench openings 216. The shallow trench openings 216 are formed in the exposed portions of the semiconductor substrate 202 to surround an active area 218 of the semiconductor substrate 202. In such a directional etch process, the area of the shallow trench openings 216 are limited to the sidewalls of the photo-resist material 210 and the sidewalls at the top of notched masking structure 214. Thus top corners 222 of the shallow trench openings 216 are exposed and face the notched surfaces 214 of the notched masking structure 212. Anisotropic etch processes individually for etching the semiconductor substrate to form the shallow trench openings 216 are known to one of ordinary skill in the art of integrated circuit fabrication.

In FIG. 16, after the anisotropic etch process, bottom corners 220 and the top corners 222 of the shallow trench openings 216 are relatively sharp. Such sharp corners 220 and 222 are disadvantageous for producing high electric fields therein in a "kink effect" as known to one of ordinary skill in the art of integrated circuit fabrication. Thus, referring to FIGS. 16 and 17, a thermal oxidation process is performed to form liner oxide 224 on the walls of the shallow trench openings 216. In one embodiment of the present invention, when the notched masking structure 212 is comprised of polysilicon, the liner oxide 224 also forms on the walls of the notched masking structure 212.

Figure 17:
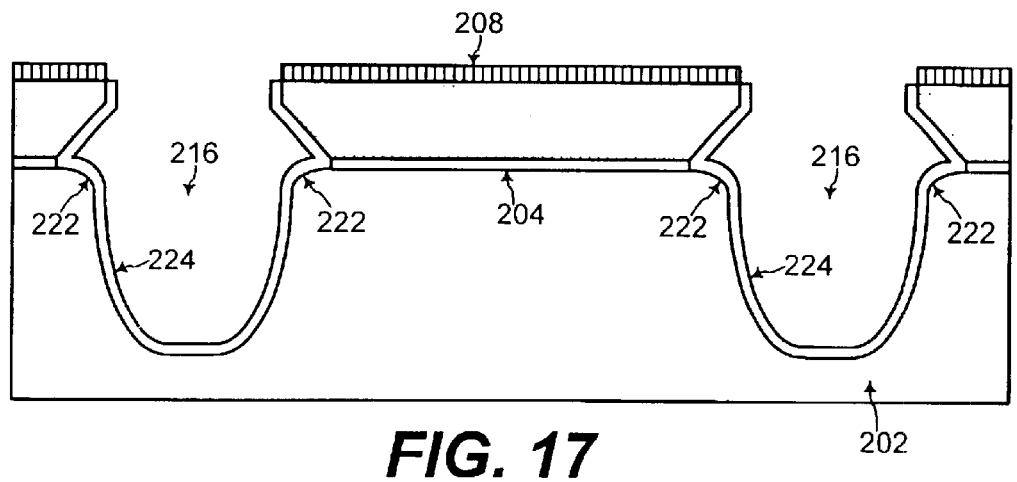

Referring to FIGS. 16 and 17, note that because the top corners 222 of the shallow trench openings 216 face toward the notched surfaces 214 of the notched masking structure 212, the top corners 222 of the shallow trench openings 216 are exposed to the thermal oxidation for forming the liner oxide 224 at such locations. Thus, the top corners 222, as well as the bottom corners 220, of the shallow trench openings 216 are advantageously rounded in this one thermal oxidation process for forming the liner oxide 224. Thermal oxidation processes individually for forming liner oxide are known to one of ordinary skill in the art of integrated circuit fabrication.

Figure 18:
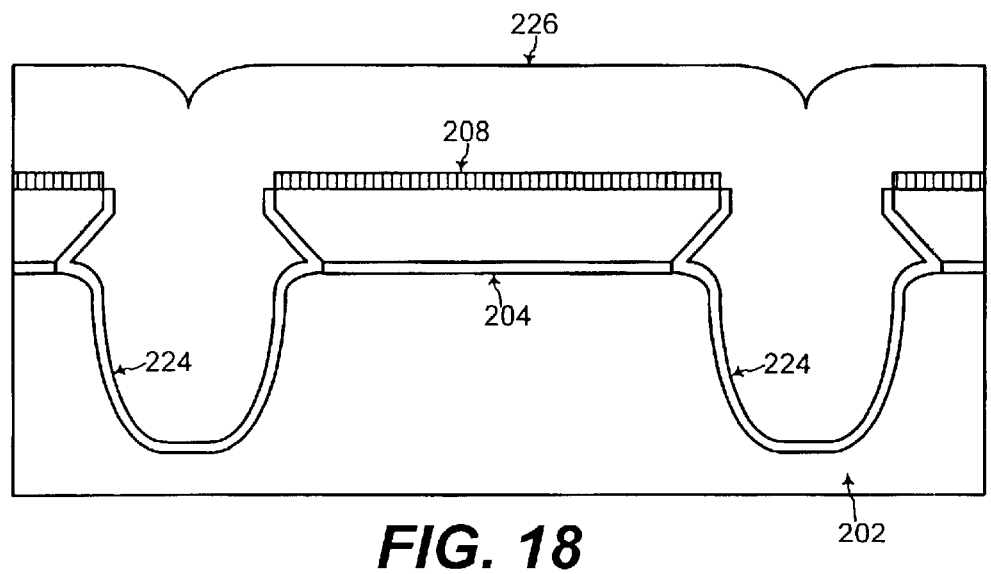

Referring to FIGS. 17 and 18, a trench dielectric material 226 is deposited to fill the shallow trench openings 216. The trench dielectric material 226 is comprised of silicon dioxide ($SiO_2$) or a low-k dielectric material (i.e., a dielectric material having a dielectric constant lower than that of silicon dioxide), according to one embodiment of the present invention. Deposition processes individually for depositing such a trench dielectric material 226 are known to one of ordinary skill in the art of integrated circuit fabrication.

Figure 19:
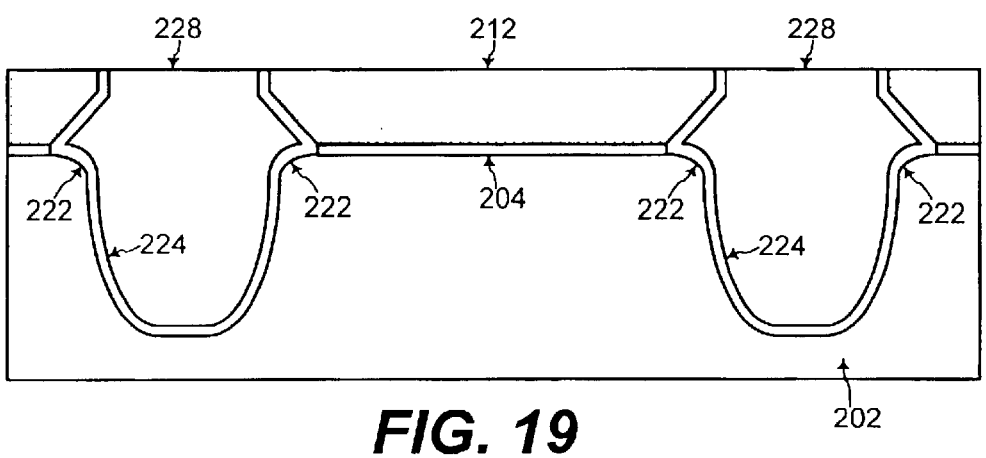

Referring to FIGS. 18 and 19, materials on the semiconductor substrate 202 are polished down until the trench dielectric material 226 is contained within the shallow trench openings 216 and until the floating gate material of the masking structure 212 is exposed. The trench dielectric material 226 filling the shallow trench openings 216 form the shallow trench isolation structures 228. Polishing processes, such a CMP (chemical mechanical polishing) processes are known to one of ordinary skill in the art of integrated circuit fabrication.

Figure 20:
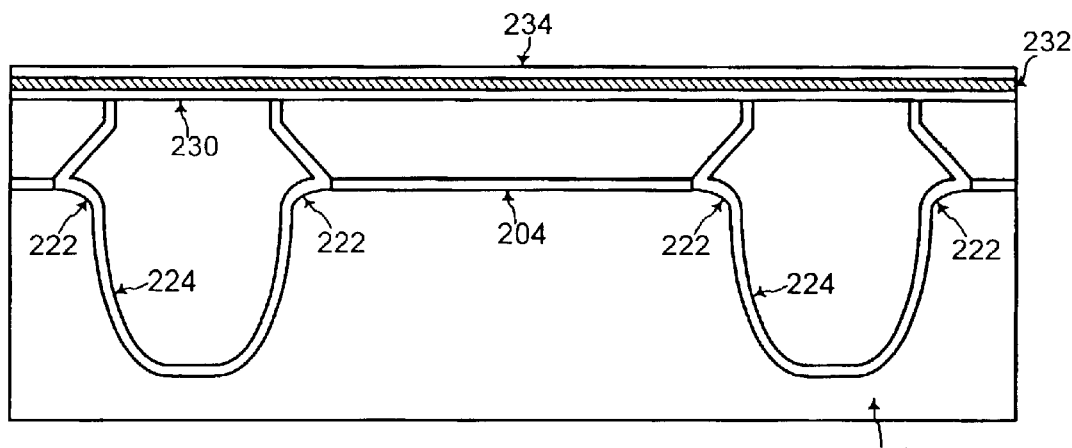

Referring to FIGS. 19 and 20, for forming a flash memory cell within the active area 218 of the semiconductor substrate 202 surrounded by the shallow trench isolation structures 228, a control gate dielectric is formed after the polishing step of FIG. 19. In the example embodiment of FIG. 20, the control gate dielectric is comprised of ONO (oxide nitride oxide) layers including a first oxide ($SiO_2$) layer 230, a nitride ($Si_XN_Y$) layer 232, and a second oxide ($SiO_2$) layer 234. ONO deposition processes individually for forming such ONO layers 230, 232, and 234 are known to one of ordinary skill in the art of integrated circuit fabrication.

The present invention may also be practiced when a high-k dielectric (i.e., a dielectric material having a dielectric constant higher than that of silicon dioxide) is also incorporated into the stack of dielectric materials forming the control gate dielectric. Thus, the present invention may be practiced when the control gate dielectric is comprised of any dielectric material including a stack of a plurality of any of silicon dioxide ($SiO_2$), silicon nitride ($Si_XN_Y$), or a high-k dielectric. However, generally, silicon nitride ($Si_XN_Y$) does not interface with the polysilicon of the floating gate or of the control gate to be formed on the control gate dielectric.

Figure 21:
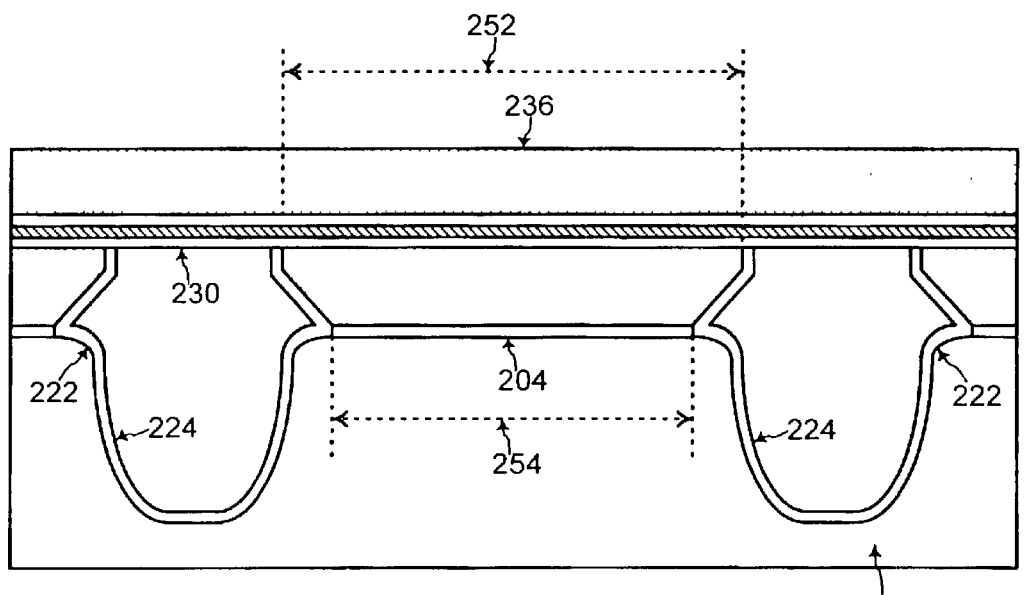

Referring to FIGS. 20 and 21, after deposition of the control gate dielectric such as the ONO layers 230, 232, and 234, a control gate material 236 is deposited on the control gate dielectric. The control gate material 236 is comprised of polysilicon according to one embodiment of the present invention. Processes individually for depositing such a control gate material 236 are known to one of ordinary skill in the art of integrated circuit fabrication.

Figure 22:
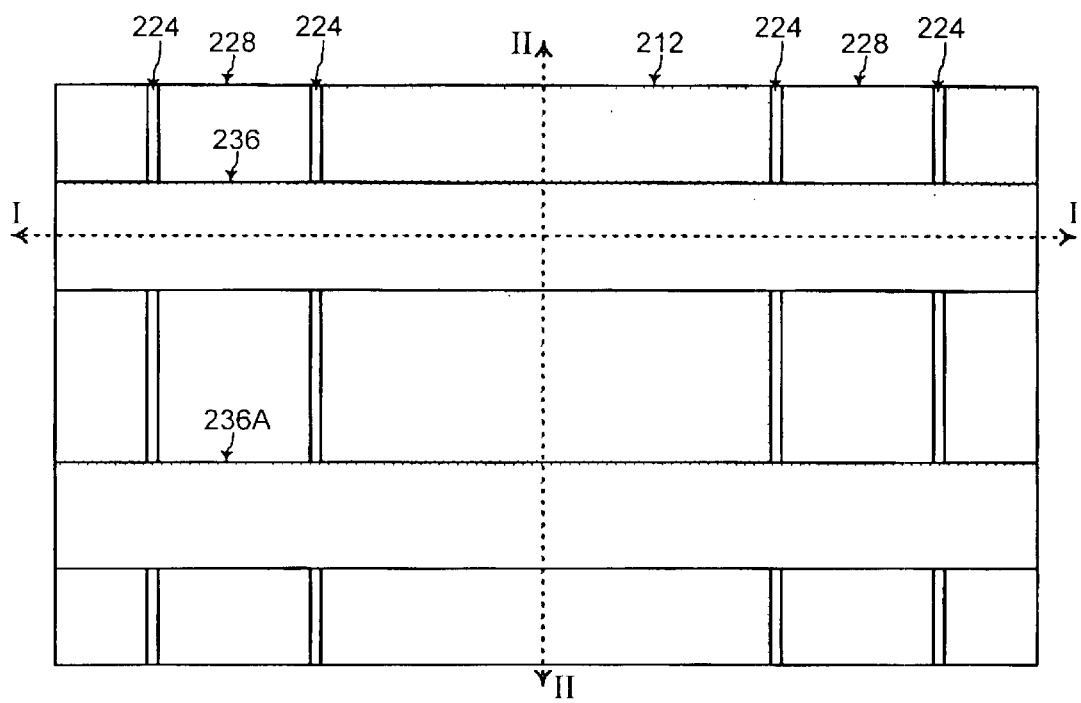
FIG. 22 shows a top view of an array of flash memory cells as fabricated in FIG. 21, according to an embodiment of the present invention.

FIG. 22 shows a top view of an array of flash memory cells having the cross-sectional structures of FIG. 21. The cross-sectional view of FIG. 21 is across line I—I of FIG. 22. Thus, in FIG. 22, the control gate material 236 runs across the shallow trench isolation structures 228. As known to one of ordinary skill in the art of flash memory technology, the control gate material 236 forms a control gate of a row of flash memory cells. In FIG. 22, another control gate 236A for another row of flash memory cells is also shown.

Figure 23:
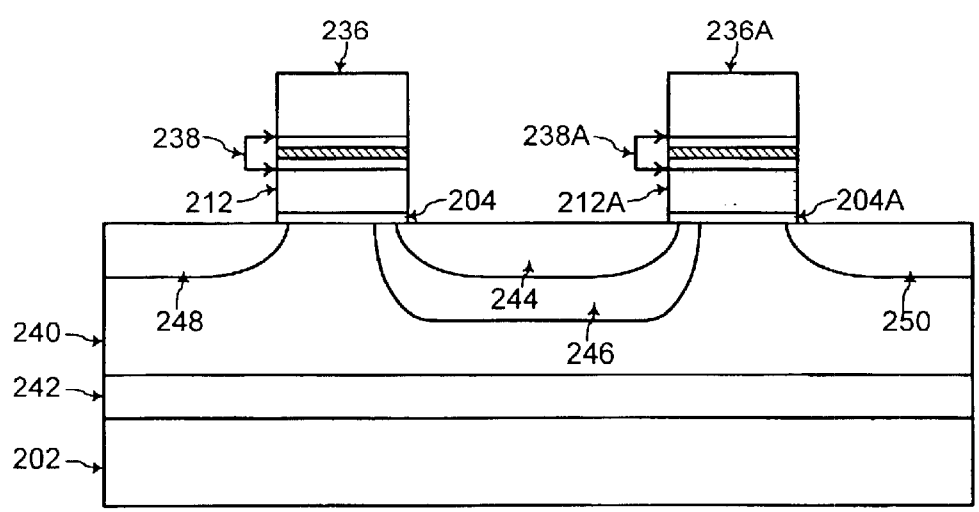
FIG. 23 shows a cross-sectional view along a dimension having the drain and source regions of the flash memory cell of FIG. 21, according to an embodiment of the present invention.

FIG. 23 shows a cross-sectional view along line II—II of FIG. 22 after any material on the semiconductor substrate 202 not under the control gate material 236 or 236A has been etched away. In FIG. 23, a first flash memory cell is formed with a first gate stack including the tunneling gate dielectric 204, the floating gate comprised of the notched masking structure 212, the control gate dielectric 238 comprised of the ONO layers 230, 232, and 234, and the control gate comprised of the control gate material 236, as described herein. Similarly, a second flash memory cell is formed with a second gate stack including the tunneling gate dielectric 204A, the floating gate 212A, the control gate dielectric 238A, and the control gate 236A, formed similarly as for the first flash memory cell.

For forming the first and second flash memory cells, a p-well 240 is formed within an N-well 242 when the semiconductor substrate 202 is P-type. A shared source region 244 is formed by implantation of an N-type dopant therein. A P-type halo region 246 is formed to surround the shared source region 244. A first drain region 248 is formed for the first flash memory cell with the gate stack 236, 238, 212, and 204, and a second drain region 250 is formed for the second flash memory cell with the gate stack 236A, 238A, 212A, and 204A, by implantation of an N-type dopant therein. Such structures of flash memory cells and processes for formation of such structures of flash memory cells are known to one of ordinary skill in the art of integrated circuit fabrication.

In this manner, referring to FIGS. 21 and 23, the top surface of the control gate 236 for the gate stacks of the flash memory cells are advantageously formed to be planar. In addition, because the notched masking structure 212 is used for both defining the active area 218 and for forming the floating gate of the flash memory cell, the floating gate 212 of the flash memory cell is already self-aligned for the flash memory cell such that all four structures including the tunneling dielectric 204, the floating gate 212, the control gate dielectric 238, and the control gate material 236 are disposed over the active area 218 of the semiconductor substrate 202 for proper operation of the flash memory cell. Also, because the notched masking structure 212 is used for both defining the location of the shallow trench isolation structures 228 and for forming the floating gate 212 of the flash memory cell, the floating gate 212 of the flash memory cell is disposed symmetrically between the two shallow trench isolation structures 228.

Furthermore, referring to FIG. 17, with the notched shape of the notched masking structure 212, the top corners 222 of the shallow trench openings 216 are exposed to the thermal oxidation for forming the liner oxide 224 on the walls of the shallow trench openings 216. Thus, the top corners 222 of the shallow trench openings 216 are rounded with a minimized number of processing steps. Additionally, referring to FIG. 21, note that a first overlap area 252 between the control gate 236 and the floating gate formed by the notched masking structure 212 is greater than a second overlap area 254 between the floating gate 212 and the semiconductor substrate 202. Thus, the coupling ratio, which is a measure of the amount of charge stored within the floating gate for a given voltage applied at the control gate, is advantageously maximized for the flash memory cell.

Figure 24:
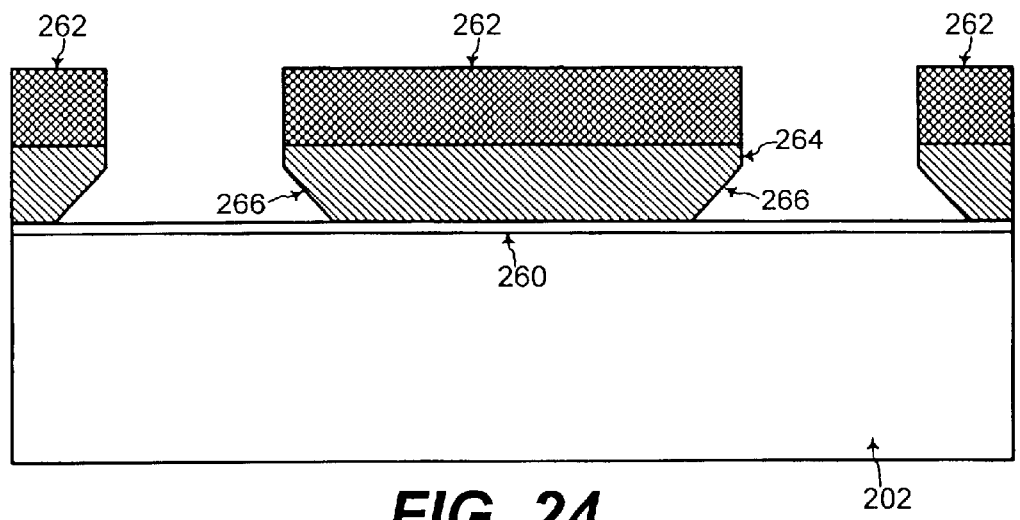
FIGS. 24, 25, 26, 27, 28, and 29 show cross-sectional views for forming shallow trench isolation structures surrounding an active area of a semiconductor substrate having a field effect transistor fabricated therein, according to another embodiment of the present invention.

FIGS. 24, 25, 26, 27, 28, and 29 show cross-sectional views for forming shallow trench isolation structures around an active area of the semiconductor substrate for forming another type of integrated circuit device thereon, according to another embodiment of the present invention. Referring to FIG. 24, a pad oxide layer 260 is formed on the semiconductor substrate 202. Processes for forming the pad oxide layer 260 on the semiconductor substrate 202 comprised of silicon or silicon doped with germanium for example are known to one of ordinary skill in the art of integrated circuit fabrication.

Figure 25:
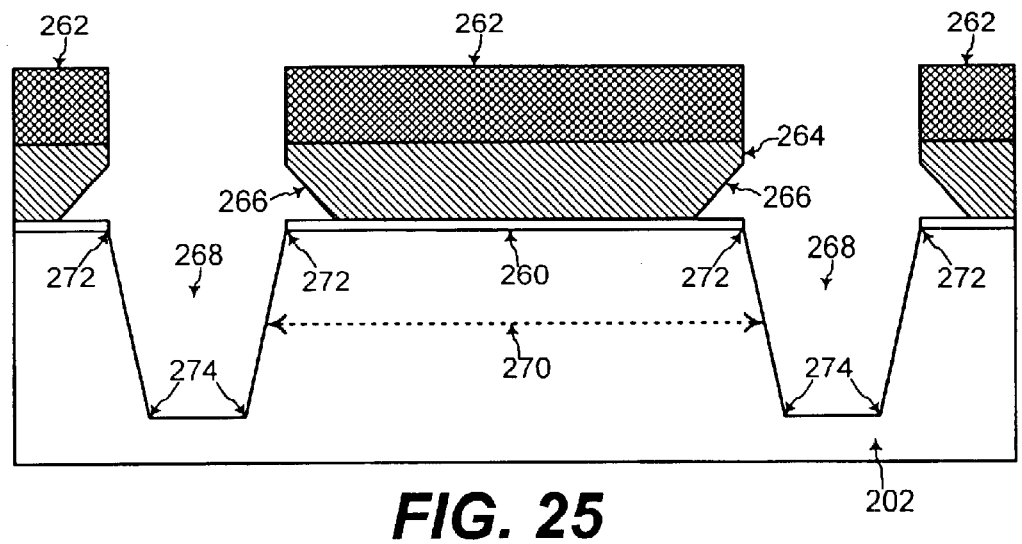

Further referring to FIG. 24, a layer of silicon nitride (Si$_X$N$_Y$) is patterned with a photo-resist material 262 to form a notched masking structure 264 with notched surfaces 266, similar to the notched masking structure 212 of FIG. 15. However, note that this embodiment of the present invention may also be practiced when the notched masking structure 264 is comprised of other types of material such as polysilicon. After formation of the notched masking structure 264, the pad oxide 260 remains. Referring to FIGS. 24 and 25, an anisotropic etch process is performed for etching into the pad oxide 260 and the semiconductor substrate 202 to form shallow trench openings 268, similarly as described in reference to FIG. 16. The shallow trench openings 268 are formed in the exposed portions of the semiconductor substrate 202 to surround an active area 270 of the semiconductor substrate 202.

In such a directional etch process, the area of the shallow trench openings 268 are limited to the sidewalls of the photo-resist material 262 and the sidewalls at the top of notched masking structure 264. Thus top corners 272 of the shallow trench openings 268 are exposed and face the notched surfaces 266 of the notched masking structure 264. In FIG. 22, after the anisotropic etch process, bottom corners 274 and the top corners 272 of tile shallow trench openings 268 are relatively sharp.

Such sharp corners 272 and 274 are disadvantageous for producing high electric fields therein in a "kink effect" as known to one of ordinary skill in the art of integrated circuit fabrication. Thus, referring to FIGS. 25 and 26, a thermal oxidation process is performed to form liner oxide 276 on the walls of the shallow trench openings 268, similarly as described in reference to FIG. 17. However, in one embodiment of the present invention, when the notched masking structure 264 is comprised of silicon nitride (Si$_X$N$_Y$), the liner oxide 276 does not form on the walls of the notched masking structure 264. In another embodiment of the present invention, if the notched masking structure 264 were comprised of polysilicon, the liner oxide 276 would form along the exposed notched surfaces 266 of the notched masking structure 264.

Figure 26:
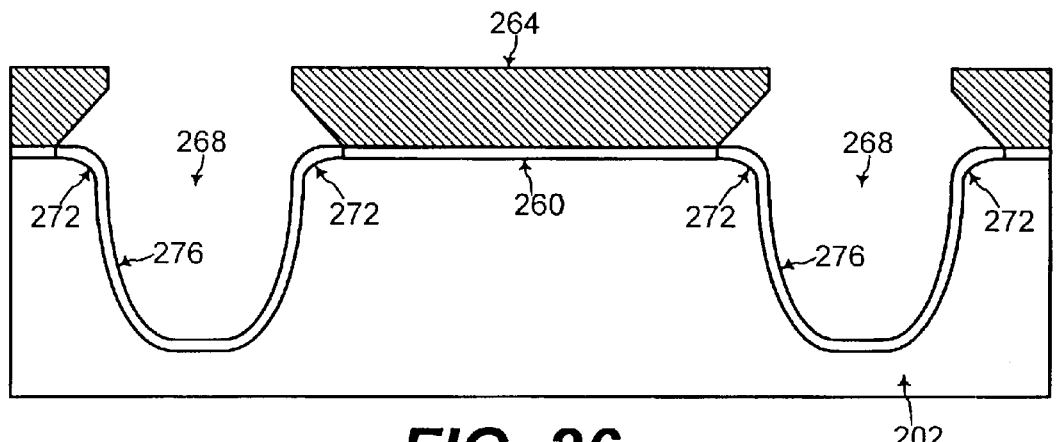

Referring to FIGS. 25 and 26, note that because the top corners 272 of the shallow trench openings 268 face toward the notched surfaces 266 of the notched masking structure 264, the top corners 272 of the shallow trench openings 268 are exposed to the thermal oxidation for forming the liner oxide 276 at such locations. Thus, the top corners 272, as well as the bottom corners 274, of the shallow trench openings 268 are advantageously rounded in this one thermal oxidation process for forming the liner oxide 276.

Figure 27:
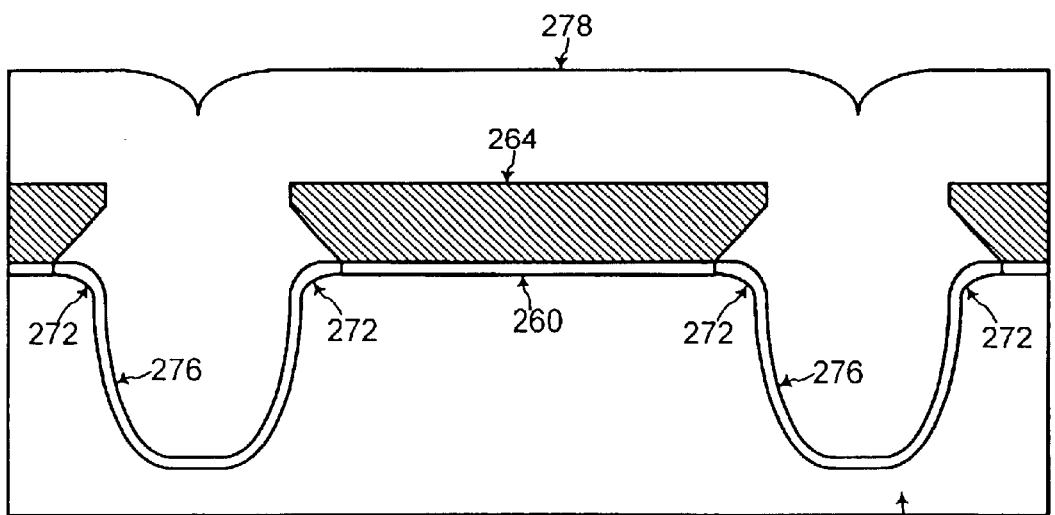

Referring to FIGS. 26 and 27, a trench dielectric material 278 is deposited to fill the shallow trench openings 268, similarly as described in reference to FIG. 18. The trench dielectric material 226 is comprised of silicon dioxide (SiO$_2$) or a low-k dielectric material (i.e., a dielectric material having a dielectric constant lower than that of silicon dioxide), according to one embodiment of the present invention.

Figure 28:
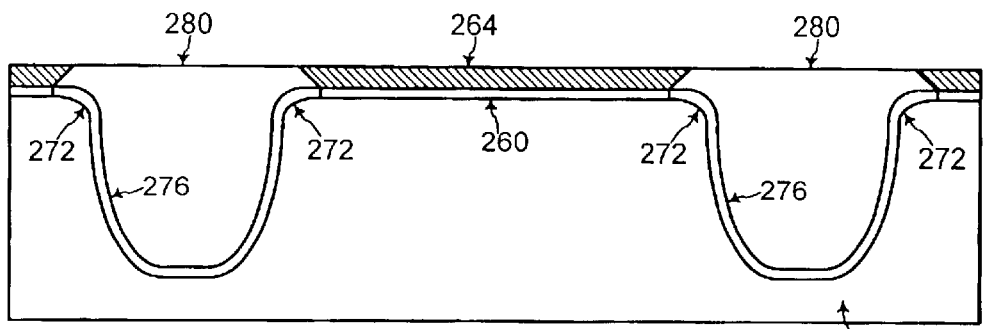

Referring to FIGS. 27 and 28, materials on the semiconductor substrate 202 are polished down until the trench dielectric material 278 is contained within the shallow trench openings 268 and until the silicon nitride (Si$_X$N$_Y$) of the masking structure 264 is exposed, similarly as described in reference to FIG. 19. However, in this embodiment of the present invention, a substantial portion of the materials including the notched masking structure 264 is polished down. The trench dielectric material 278 filling the shallow trench openings 268 forms the shallow trench isolation structures 280.

Figure 29:
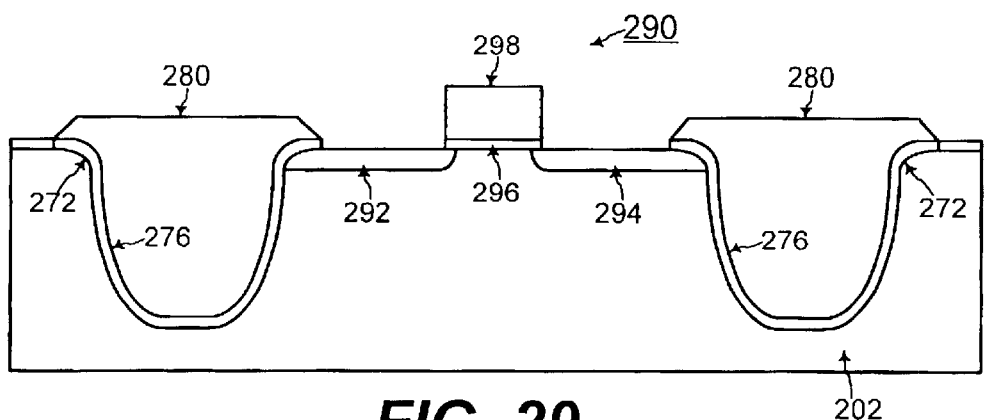
Figure 30:
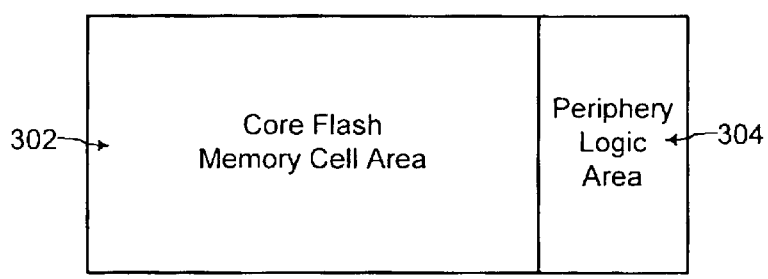
FIG. 30 shows parts of a flash memory device including a core flash memory cell area for holding the flash memory cell of FIG. 21 and including a periphery logic area for holding the field effect transistor of FIG. 29, according to an embodiment of the present invention.

Referring to FIGS. 28 and 29, the silicon nitride (Si$_X$N$_Y$) of the masking structure 264 and the pad oxide 260 are etched away to expose the semiconductor substrate 202 in the active area 270 of the semiconductor substrate 202. Processes for etching away the masking structure 264 and the pad oxide 260 are known to one of ordinary skill in the art of integrated circuit fabrication. An integrated circuit device such as a field effect transistor 290 for example is fabricated within the active area 270 of the semiconductor substrate 202. Thus, a drain region 292, a source region 294, a gate dielectric 296, and a gate structure 298 are formed within the active area 270 of the semiconductor substrate 202.

Processes for forming such structures of the field effect transistor 290 are known to one of ordinary skill in the art of integrated circuit fabrication. Referring to FIGS. 21, 23, 29, and 30, the flash memory cells of FIGS. 21 and 23 may be fabricated within a core flash memory cell area 302 of a flash memory device, and the field effect transistor 290 of FIG. 29 may be fabricated within a periphery logic area 304 of the flash memory device, according to one embodiment of the present invention.

Note that in one embodiment of the present invention, when the notched masking structure 212 for forming a flash memory cell within the core flash memory cell area 302 and the notched masking structure 264 for forming the field effect transistor within the periphery logic area 304 are both comprised of polysilicon, such notched masking structures 212 and 264 for both areas 302 and 304 may be formed simultaneously in same etching processes from deposition of a same layer of polysilicon in both areas 302 and 304. Processing steps for forming such notched masking structures 212 and 264 simultaneously from the same layer of polysilicon in both areas 302 and 304 would be apparent to one of ordinary skill in the art of integrated circuit fabrication from the description herein.

In this manner, in the embodiment of FIGS. 24, 25, 26, 27, 28, and 29 with the notched shape of the notched masking structure 264, the top corners 272 of the shallow trench openings 268 are exposed to the thermal oxidation for forming the liner oxide 276 on the walls of the shallow trench openings 268. Thus, the top corners 272 of the shallow trench openings 268 are rounded with a minimized number of processing steps.

The foregoing is by way of example only and is not intended to be limiting. Any specified material or any specified dimension of any structure described herein is by way of example only. For example, the present invention may be practiced when the notched masking structure 212 is comprised of any other types of conductive or semiconductor material aside from polysilicon for forming a self-aligned floating gate of a flash memory cell in FIG. 21. In addition, the present invention may be practiced when the notched masking structure 264 is comprised of any other types of material aside from silicon nitride or polysilicon in FIG. 28.

In addition, as will be understood by those skilled in the art, the structures described herein may be made or used in the same way regardless of their position and orientation. Accordingly, it is to be understood that terms and phrases such as "on", "side", and "top" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

What is claimed is:

1. A method of fabricating a flash memory cell, including the steps of:
   forming a floating gate having a notched structure over an active area of a semiconductor substrate;
   filling a shallow trench opening with a trench dielectric material at a side of the active area with a top corner being rounded;
   planarizing the floating gate and the trench dielectric material such that exposed surfaces of the floating gate and the trench dielectric material are level surfaces; and
   depositing a control gate dielectric and a control gate material on the level surfaces of the floating gate and the trench dielectric material.

2. The method of claim 1, further including:
   forming a liner at the top corner to round the top corner and on walls including a bottom corner of the shallow trench opening.

3. The method of claim 1, wherein the shallow trench opening surrounds the active area.

4. The method of claim 1, wherein the trench dielectric material is one of silicon dioxide or a low-k dielectric material.

5. The method of claim 1, further including the steps of:
   forming a tunneling gate dielectric on the active area at a bottom of the floating gate; and
   forming drain and source regions within the active area for forming the flash memory cell.

6. The method of claim 1, wherein the floating gate with the notched structure has a first planar overlap area between the floating gate and the control gate material that is larger than a second planar overlap area between the floating gate and the active area, for maximizing a coupling ratio of the flash memory cell.

7. The method of claim 1, wherein the step of forming the floating gate includes the steps of:
   depositing a layer of tunneling gate dielectric on the semiconductor substrate;
   depositing a layer of a floating gate material on the layer of tunneling gate dielectric;
   depositing a layer of an ARC (anti-reflective coating) material on the layer of the floating gate material;
   performing an anisotropic etch process to pattern a top portion of the notched structure of the floating gate with the ARC (anti-reflective coating) material remaining on top of the notched structure; and
   performing a partially isotropic etch process to pattern a bottom portion of the notched structure.

8. The method of claim 5, wherein:
   the tunneling gate dielectric is comprised of one of silicon dioxide ($SiO_2$) or a high-k gate dielectric material;
   the floating gate and the control gate are comprised of polysilicon; and
   the control gate dielectric is comprised of a stack of any of silicon dioxide ($SiO_2$), silicon nitride ($Si_xN_y$), and a high-k dielectric material.

9. A method of fabricating shallow trench isolation structures, including the steps of:
   forming a first notched masking structure for defining a first active area of a semiconductor substrate for forming a flash memory cell;
   forming a second notched masking structure for defining a second active area of the semiconductor substrate for forming a transistor;
   wherein the first and second notched masking structures are patterned simultaneously; and
   forming and filling a first shallow trench opening with a trench dielectric material to surround the first active area and forming and filling a second shallow trench opening with the trench dielectric material to surround the second active area.

10. The method of claim 9, wherein top corners of the first and second shallow trench openings are exposed and face a respective notched surface of the first and second notched masking structures, the method further including the step of:
    forming a liner at the top corners of the first and second shallow trench openings to round the top corners.

11. The method of claim 9, wherein the first active area is within a core flash memory cell area of the semiconductor substrate, and wherein the second active area is within a periphery logic area of the semiconductor substrate.

12. The method of claim 9, further including:
    planarizing the notched masking structures and the trench dielectric material such that exposed surfaces of the notched masking structures and the trench dielectric material are level surfaces; and
    depositing a control gate dielectric and a control gate material on the level surfaces of the first notched masking structure and the trench dielectric material,
    and wherein the first notched masking structure forms a floating gate of the flash memory cell.

13. The method of claim 12, further including the step of forming a tunnel dielectric at the bottom of the first notched masking structure.

14. The method of claim 13, wherein the trench dielectric material is one of silicon dioxide or a low-k dielectric material.

15. The method of claim 12, wherein a first planar overlap area between the floating gate and the control gate material is larger than a second planar overlap area between the floating gate and the first active area, for maximizing a coupling ratio of the flash memory cell.

16. The method of claim 9, further including the steps of:
    planarizing the notched masking structures and the trench dielectric material such that exposed surfaces of the notched masking structures and the trench dielectric material are level surfaces;
    etching away the second notched masking structure to expose the second active area; and
    forming the transistor within the second active area.

17. The method of claim 16, wherein a field effect transistor is formed within the second active area.

18. The method of claim 16, wherein the field effect transistor is part of a periphery logic of a flash memory device.

19. The method of claim 16, further including the step of:
    forming a gate dielectric material on the second active area at a bottom of the second notched masking structure.

20. The method of claim 16, further including the step of:
    forming a pad oxide on the second active area at a bottom of the second notched masking structure.

21. The method of claim 16, wherein the second notched masking structure is comprised of a dielectric material or a semiconductor material.

* * * * *